SOLID STATE DEVICE AND METHOD OF MAKING SAME

Original Filed June 11, 1957 2 Sheets-Sheet 1

INVENTOR
GEORGE ABRAHAM
BY Glenn S. Rivevik AGENT
Richard C. Reed
ATTORNEY

SOLID STATE DEVICE AND METHOD OF MAKING SAME

Original Filed June 11, 1957 2 Sheets-Sheet 2

INVENTOR
GEORGE ABRAHAM
BY Glenn S. Overick AGENT
Richard C. Reed
ATTORNEY

United States Patent Office

Re. 25,087
Reissued Nov. 21, 1961

25,087
SOLID STATE DEVICE AND METHOD OF MAKING SAME

George Abraham, 3107 Westover Drive SE., Washington, D.C.

Original No. 2,974,262, dated Mar. 7, 1961, Ser. No. 665,102, June 11, 1957. Application for reissue Aug. 11, 1961, Ser. No. 131,028
8 Claims. (Cl. 317—234)

(Granted under Title 35, U.S. Code (1952), sec. 266)

Matter enclosed in heavy brackets [ ] appears in the original patent but forms no part of this reissue specification; matter printed in italics indicates the additions made by reissue.

The invention described herein may be manufactured and used by or for the Government of the United States of America for governmental purposes without the payment of any royalties thereon or therefor.

This invention relates in general to the manufacture of solid state devices and in particular to the forming of a semiconductor signal translator.

In the prior art, the electrical characteristics of solid state devices have been controlled by "forming." Solid state devices, for example, have been formed to control their impedances so that they will have improved performance in electrical amplifier and rectifier circuits. Heretofore, however, it has not been possible to form solid state devices so that their voltage-current characteristics curves would have a plurality of negative resistance regions at selected potential levels.

In accordance with the foregoing, it is an object of the present invention to provide a solid state device having a voltage-current characteristic that includes a plurality of negative resistance regions.

Another object of the present invention is to provide a method of forming solid state devices in which a predetermined small quantity of forming energy is applied to a solid state device to provide the voltage-current characteristic of the solid state device with a negative resistance region.

Another object of the present invention is to provide a method of forming solid state devices in which a series of small quantities of forming energy is applied to an electrode of a solid state device and is interrupted when the voltage-current characteristic of the device acquires a negative resistance region.

Another object of the present invention is to provide a method for forming a solid state device in which a source of dynamic B+ is applied to the body of the device and in which a series of small quantities of forming energy is applied to an electrode of the device and is interrupted when the voltage-current characteristic of the solid state device has acquired a desired negative resistance region.

Another object of the present invention is to provide a method of forming a solid state device in which a source of dynamic B+ is applied to the device to temporarily remove previously formed negative resistance regions from the voltage-current characteristic of the solid state device while a series of small quantities of energy is applied to the device to provide an additional negative resistance region in the voltage-current characteristic.

Another object of the present invention is to provide a solid state device having a body of a first type of semiconductor material in which particles of a second type of semiconductor material have been dispersed in discrete zones in the latice of the body to form p-n junctions.

Other objects and many of the attendant advantages of this invention will be readily apparent as the same becomes better understood when considered in connection with the accompanying drawings in which:

FIG. 1 discloses an arrangement for forming a solid state device in accordance with the present invention.

As used in the present application, "dynamic B+" is defined as a periodically varying potential applied to a selected nonlinear device to store energy therein and to enable the device to function as an amplifier and/or to exhibit a negative resistance characteristic. As an example, a source of dynamic B+ may be a source of recurring signals providing signals having a frequency or repetition rate greater than the reciprocal of the lifetime of electrical charge carriers injected into the variable impedance device to which the source of dynamic B+ is connected.

In accordance with the present invention, a solid state device is provided whose voltage-current characteristic has a plurality of negative resistance regions. This is accomplished by applying forming energy to an electrode of the solid state device to effect the migration of atoms from the electrode into the body of the device and thereby create lattice defects which establish a plurality of p-n junctions in discrete zones in the body near the surface of the solid state device to which the electrode is connected.

In one embodiment of the present invention, a first series of small quantities of forming energy is applied to an electrode of the solid state device while the voltage-current characteristic of the device is monitored. The first series is terminated when the characteristic has acquired a first negative resistance region at a first potential level. A source of dynamic B+ is then applied to the solid state device and the magnitude of the dynamic B+ is adjusted to temporarily remove the first negative resistance region. Thereafter, a second series of small quantities of forming energy at an energy level higher than the first series is applied to the electrode. The voltage-current characteristic of the solid state device is again monitored and the second series is terminated when the characteristic has acquired a second negative resistance region at a second potential level. The source of dynamic B+ is then removed and the characteristic regains the first negative resistance region. In this way, the solid state device is formed so that it will have a voltage-current characteristic that has two negative resistance regions. It is, of course, understood that the same steps may be followed to provide the characteristic with additional negative resistance regions at various potential levels.

Figure 1:
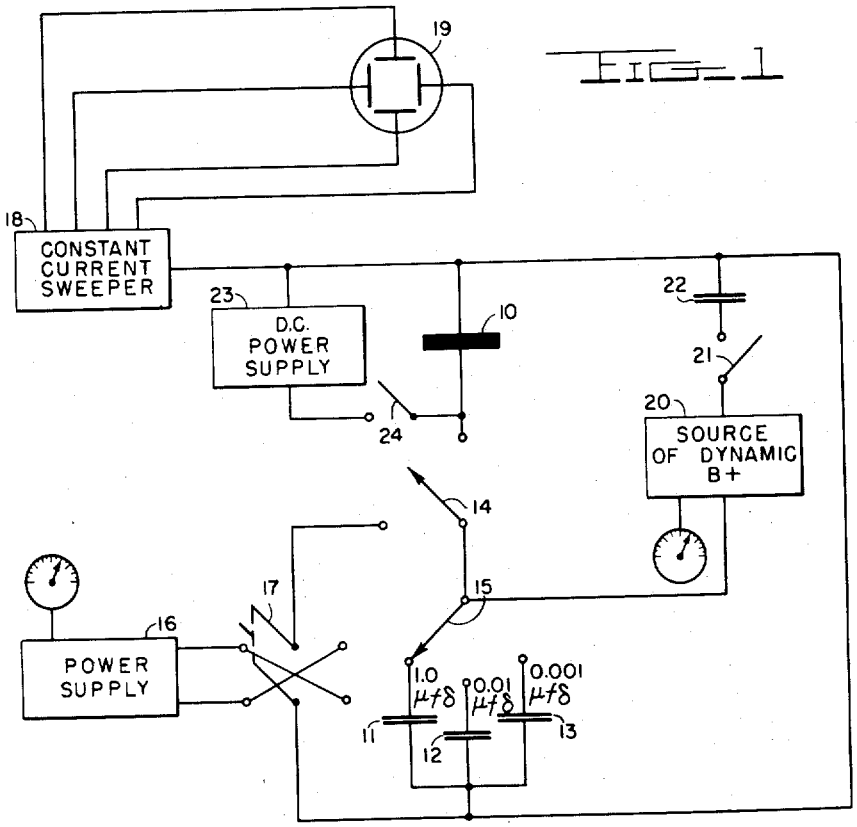

Referring to FIG. 1, solid state device 10 may be selectively connected in series with capacitors 11, 12, or 13 through switches 14 and 15. Power supply 16 may be connected across capacitors 11, 12, or 13 through double pole, double throw switch 17 and switches 14 and 15. Constant current sweeper 18 is connected between solid state device 10 and cathode ray tube indicator 19. The source of dynamic B+ 20 may be connected through switch 21 and capacitor 22 across solid state device 10 depending upon the position of switches 14 and 15. And, D.C. power supply 23 may be connected across solid state device 10 through switch 24.

Solid state device 10 may be any device having a body of one type of semiconductor material and an electrode connected thereto of another type of semiconductor material. For example, the body may be a single crystal of N-type material which has been doped to give a resistivity of 5 ohm-cm. and the electrode may be of Phosphor bronze, a material having P-type impurities. The connection of the electrode to the body may be, for example, of the type conventionally used in point contact transistors.

The value of capacitors 11, 12 and 13 and the magnitude of direct current voltage that is applied to these capacitors by power supply 16 will depend upon the magnitude of energy that is to be applied to the solid state device for forming purposes i.e., to move atoms from the electrode into the body to cause lattice defects therein. The magnitude of energy that is required is dependent on such factors as: resistivity and composition of the body of the solid state device, chemistry and composition of the electrode, nature of the connection between the electrode and the body, initial surface states, history of the device i.e., whether there has been previous forming, and the form factor of the energy that is applied to the solid state device. For example, if the solid state device 10 has an N-type body of 5 ohm-cm. and pressure contact between the body and a Phosphor bronze electrode, the values of capacitors 11, 12, and 13 will be of the order of 1.0 $\mu\mu$f., 0.01 $\mu\mu$f., and 0.001 $\mu\mu$f., respectively, and the voltage that will be applied to these capacitors will be of the order of 140 v. D.C.

The source of dynamic B+ may be any source of recurring signals so long as the frequency or repetition rate of the recurring signals is greater than the reciprocal of the lifetime of the injected electrical charge carriers, and so long as the electrode of the semiconductor device 10 to which the forming energy is applied is driven positive with respect to the base during each cycle of operation. In the arrangement shown in FIG. 1, a constant voltage square wave generator which has a typical repetition rate of 1 mc. with a 50% duty cycle is used as a source of dynamic B+. If desired the source of dynamic B+ may be supplemented by a source of optical dynamic B+ applied to the p-n junction by a light source and a chopper.

Since solid state device 10 has a body of N-type material, the electrical charge carriers stored in the body will be holes. If solid state device had a body of P-type material, the stored electrical charge carriers would be electrons.

In the arrangement shown in FIG. 1, constant current sweeper 18 is a conventional constant current instrument. A constant current instrument is used since the avalanche negative resistance region of the voltage-current characteristic to be monitored is N-type or current controlled.

Figure 2:
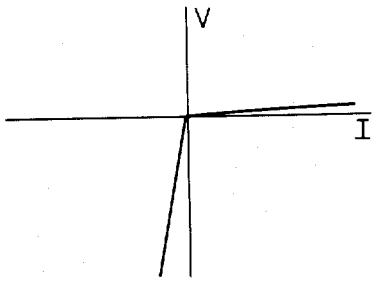
FIG. 2 is a voltage-current characteristic of a solid state device before it is formed in accordance with the present invention.

In applying one embodiment of the method taught by the present invention, switches 21 and 24 are opened, switch 14 is placed in the upper position shown in FIG. 1, and switch 15 is positioned so that capacitor 13 is in series with solid state device 10. (The voltage-current characteristic of the solid state device, as viewed on cathode ray indicator 19, will be as shown in FIG. 2.) After double pole, double throw switch 17 is thrown to the right hand position as shown in FIG. 1, switch 14 is positioned first to charge capacitor 13 and then to apply the energy stored therein to solid state device 10. If the quantity of energy applied to the solid state device has the proper value, the device will acquire a voltage current characteristic having the negative resistance region XY shown in FIG. 3. The correct value of the quantity of energy to be applied to obtain this negative resistance characteristic will be dependent on such factors as: resistivity and composition of the body, chemistry and composition of the electrode and the body, initial surface states, history of the device, i.e., whether there has been previous forming, and the form factor of the energy that is applied to the solid state device.

Figure 3:
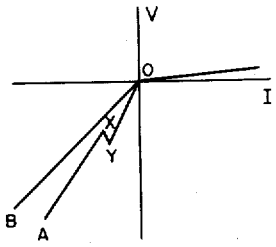
FIG. 3 shows a voltage-current characteristic for a solid state device which has been provided with a negative resistance region in accordance with the present invention and a voltage-current characteristic of the device when it has been overformed.

If the value of the quantity of energy applied to the solid state device is too great, the device will acquire the voltage-current characteristic OB in FIG. 3. (This voltage-current characteristic is similar to that obtained by present collector forming techniques in the manufacture of point contact transistors.) Double pole, double throw switch 17 may then be reversed, i.e., thrown in the left hand position shown in FIG. 1 and a small quantity of energy applied to solid state device 10 in a direction opposite to that of the quantity of energy mentioned above. Provided that solid state device 10 has not been "overformed" and the quantity of energy applied in the opposite direction is of the proper magnitude, the solid state device will acquire a voltage-current characteristic having a negative resistance region XY as shown in FIG. 3.

Figure 4:
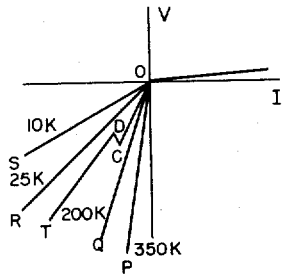
FIG. 4 shows a family of voltage-current characteristics for a particular solid state device including a negative resistance characteristic provided in accordance with the instant invention.

Referring to FIG. 4, for a typical solid state device, one might expect a negative resistance region to appear in a voltage-current characteristic located between the voltage-current characteristics OR and OQ. If the magnitude of the quantity of energy applied to solid state device 10 is such as to give the device a voltage-current characteristic having an average impedance of less than 25K, it is likely that the device will be "overformed," and it will not be possible to obtain a negative resistance region in its voltage-current characteristic by applying to the device a small quantity of energy having a polarity opposite to that of the initial quantity of energy applied to the solid state device.

Figure 5:
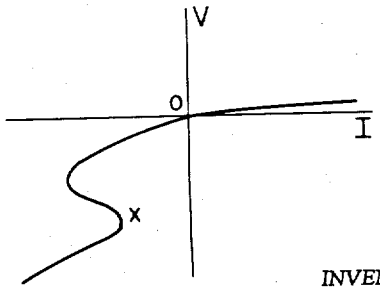
FIG. 5 is the voltage-current characteristic of a solid state device in which a steady state of electrical charge carriers have been stored, the steady state having a magnitude such that the device acquires a negative resistance characteristic.

In applying a second embodiment of the present invention, the first step is to close switch 21, open switch 24, and position switches 14 and 15 to connect solid state device in parallel with capacitor 13 and throwing double pole, double throw switch 17 in the right hand position shown in FIG. 1. The voltage-current characteristic of solid state device 10 will be as shown in FIG. 5. The shape of the voltage-current characteristic curve in this figure is attributed to the storage of a steady state of electrical charge carriers in the body of the solid state device as explained in copending U.S. application Ser. No. 629,763, filed December 20, 1956, entitled "Electrical Switching Circuit," now Patent No. 2,939,966, and in copending U.S. application Ser. No. 629,761, filed December 20, 1956, entitled "Electrical Amplifying Circuit," now Patent No. 2,941,094. The next step in the second embodiment is to open switch 21 to remove source of dynamic B+ 20 from the solid state device and to sequentially and successively position switch 14 to charge capacitor 13 and then discharge the capacitor through solid state device 10, thereby applying a series of small quantities of forming energy to the solid state device.

Referring to FIG. 4, as the series of small quantities of energy is applied to the electrode, the slope of the voltage-current of the solid state device will decrease from OP to OQ. If the series is continued, solid state device 10 will acquire voltage-current characteristic OT having negative resistance region DC. Should the series be continued thereafter, the negative resistance region will be lost as indicated by voltage-current characteristic OB in FIG. 3. It may be regained, however, by reversing double pole, double throw switch 17 and applying a small quantity of energy to the solid state device, provided that the series of small quantities of energy is interrupted before the slope of the voltage-current characteristic decreases below OR. If the slope decreases below OR, it is not likely that the negative resistance region could be regained by applying a small quantity of energy to solid state device 10 that has a polarity opposite to that of the series of small quantities of forming energy.

Figure 6:
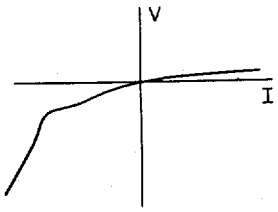
FIG. 6 is the voltage-current characteristic of a solid state device after the magnitude of dynamic B+ applied to the device has been adjusted to temporarily eliminate a negative resistance region in the voltage-current characteristic.

After the desired negative resistance region CD is obtained, switch 21 is closed to apply the source of dynamic B+ 20 to solid state device 10. The magnitude of the dynamic B+ is then adjusted to temporarily remove the negative resistance region CD of the voltage-current characteristic shown in FIG. 4. This is accomplished by incleasing the magnitude of the dynamic B+ to increase the area under the portion TV of the characteristic curve shown in FIG. 5 until it blankets or shields the negative resistance portion CD of voltage-current characteristic OT shown in FIG. 4. The voltage-current characteristic shown in FIG. 6 will then be observed on cathode ray indicator 19.

Figure 7:
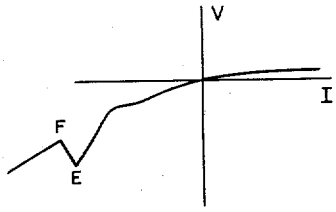
FIG. 7 is the voltage-current characteristic of a solid state device after a source of dynamic B+ is applied to the device to temporarily remove a previously formed negative resistance region and the device is formed to provide the voltage-current characteristic with a second negative resistance region.

Following this operation, switch 15 is positioned and switch 14 is sequentially and successively positioned to charge capacitor 12 and then discharge the capacitor through solid state device 10 to apply a second series of small quantities of energy to the solid state device. When the voltage-current characteristic shown in FIG. 7 is observed on cathode ray tube indicator 19, the second series of small quantities of forming energy is interrupted.

Figure 8:
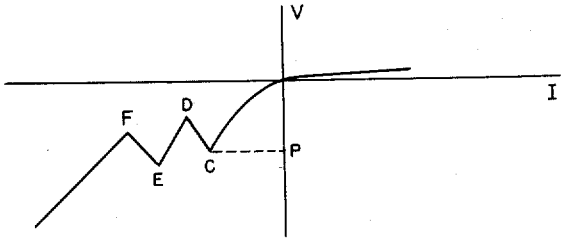
FIG. 8 is the voltage-current characteristic of a solid state device after a second negative resistance region has been formed and after the solid state device has regained a first negative resistance region that was temporarily removed by the application of a source of dynamic B+ to the solid state device.

Switch 21 is then opened to remove the source of dynamic B+ 20 from solid state device 10. When this is done, the voltage-current characteristic of the solid state device will regain negative resistance region CD and, as shown in FIG. 8, the characteristic will have two negative resistance regions, namely CD and EF. It is, of course, understood that the above method could be used to provide the solid state device with as many negative resistance regions as desired.

The negative resistance regions CD and EF shown in FIG. 8 are attributed to the fact that atoms of P-type material are moved from the electrode into the body of the solid state device by the first and second series of small quantities of forming energy. The atoms cause interstitial and substitutional lattice defects in the body to form p-n junctions in zones up to 25 microns from the surface of the body in the area where the electrode is connected. A "zone" in the body of the solid state device may be defined on an atomic scale and may include a single atom of an impurity element or a cluster of impurity atoms located in the lattice structure of the body of the device.

Referring to FIG. 8, the potential P at which the negative resistance region DC will appear is dependent upon the intrinsic conductivity on the high resistivity side of the p-n junction to which the negative resistance region is attributed. The range over which the negative resistance region CD extends will depend upon the number of atoms deposited in the p region of the last mentioned p-n junction.

If desired, the voltage-current characteristic shown in FIG. 8 could be obtained without applying the source of dynamic B+ to solid state device 10. The source of dynamic B+ is applied when it is desired to lower the conductivity of the base of the solid state device so that smaller quantities of energy can be applied to the solid state device to obtain a predetermined negative resistance region; or when it is desired to temporarily remove a negative-resistance region while a series of small quantities of forming energy is applied to the solid state device to provide the voltage-current characteristic of the same with another negative resistance region.

In a third embodiment of the present invention, a small quantity of energy having a predetermined value is applied to the electrode to provide the solid state device with a first negative resistance region at a first potential level. (The steps employed to accomplish this end may be the same as those employed in the first embodiment described above.) The source of dynamic B+ is then applied to the solid state device and adjusted to the magnitude required to temporarily remove the first negative resistance region. (This step is the same as the one described in the second embodiment for accomplishing the same end.) A second small quantity of energy is then applied to the electrode to provide the solid state device with a second negative resistance level. Finally, the source of dynamic B+ is removed from the solid state device which then regains the first negative resistance region. In this way, the voltage-current characteristic of the device is provided with a first and second negative resistance region. It is, of course, understood that if desired the above steps could be repeated to provide the device with additional negative resistance regions.

In applying the method taught by the present invention, it is necessary to employ a small quantity or small quantities of energy that have the proper form factor. If energy is applied to the electrode too slowly, an insufficient number of atoms from the electrode will be deposited in the body of the solid state device. If energy is applied too rapidly, too many atoms will be deposited.

Thus, in FIG. 1 an arrangement is shown for controlling the time constant of the circuit, which in turn controls the form factor of the forming energy applied to the electrode of solid state device 10. The magnitude of the impedance of solid state device 10 may be controlled by the bias applied to the solid state device. This together with the selected values of capacitors 11, 12, and 13 and the selected magnitude of the voltage applied to these capacitors will determine in part the time constant of the circuit and the form factor of the energy applied to solid state device 10. Hence, in the arrangement shown in FIG. 1, the form factor of the energy applied to the electrode can be controlled by closing switch 24 and adjusting the plus or minus bias applied by D.C. power supply 23 to solid state device 10.

Various modifications are contemplated and may obviously be restorted to by those skilled in the art without departing from the spirit and scope of the invention as hereinafter defined by the appended claims, as only a preferred embodiment thereof has been disclosed.

What is claimed is:

1. A solid state device comprising a body of a first type of semiconductor material in which particles of a second type of semiconductor material have been locally dispersed in the crystal lattice thereof, and an electrode connected to said body.

2. A solid state device comprising a body of a first type of semiconductor material in which particles of a second type of semiconductor material have been dispersed in discrete zones in the crystal lattice, and an electrode connected to said body.

3. A solid state device comprising a body of semiconductor material having a plurality of p-n junctions which break down at different potential levels and which are located in discrete zones in the crystal lattice and an electrode connected to said body.

4. A solid state device comprising a body of semiconductor material having a resistivity of the order of 5 ohm-cm. in which particles of a second type of semiconductor material have been dispersed in discrete zones in the crystal lattice to establish p-n junctions, and an electrode connected to said body.

5. A solid state device comprising a body having a first surface and a second surface, said body consisting of semiconductor material having a resistivity in the order of 5 ohm-cm. in which particles of another type of semiconductor material have been dispersed in discrete zones in the crystal lattice to establish p-n junctions in distances up to approximately 25 microns from said first surface, and an electrode connected to said first surface.

6. The method of forming a solid state device having a semiconductor body and an electrode connected to said body, which comprises successively applying each of a plurality of series of small quantities of forming energy to said electrode, each of said series being at different energy levels, applying high frequency energy to said body, monitoring the voltage-current characteristic of said solid state device, interrupting the application of each of said series when said voltage-current characteristic has acquired a desired negative resistance region, each negative resistance region occurring at a different potential level, and increasing the magnitude of high frequency energy applied to said body after the application of each series of small quantities of forming energy to shield the negative resistance region formed by the preceding series while a succeeding series is applied.

7. The method of forming a solid state device having a selected voltage-current characteristic and including a semiconductor and an electrode connected to said body, which comprises applying forming energy having a first selected level in small successive quantities to said electrode until said voltage-current characteristic acquires a first negative resistance region, applying high frequency energy to said electrode having a magnitude such that said first negative resistance region is shielded, applying forming energy having a second selected level in small successive quantities to said electrode until said voltage-current characteristic acquires a second negative resistance region, said first and second negative resistance regions occurring at different potential levels, and removing said high frequency energy from said electrode.

8. The method of forming a solid state device having a desired voltage-current characteristic and including a semiconductor body and a first and second electrode connected to said body, which comprises successively applying each of a plurality of series of forming pulses to said first electrode, applying a series of alternating potential pulses to the first electrode such that the first electrode is driven positive with respect to the second electrode during each cycle of operation, whereby minority charge carriers are injected into said body, said series of alternating pulses being so closely spaced that the number of minority charge carriers injected by a pulse in said series does not decrease substantially before the next pulse of said series is applied to said first electrode, interrupting the application of each series of said plurality of series of forming pulses when said voltage-current characteristic acquires a desired negative resistance region at a selected potential level, and varying the spacing in said series of alternating pulses after the application of each series of forming pulses, thereby temporarily removing the negative resistance region formed by the preceding series of forming pulses while a succeeding series of forming pulses is being applied.

References Cited in the file of this patent or the original patent

UNITED STATES PATENTS

| | | |
|---|---|---|
| 2,476,989 | Martinet et al. | July 26, 1949 |
| 2,497,649 | Amsden | Feb. 14, 1950 |
| 2,577,803 | Pfann | Dec. 11, 1951 |
| 2,615,965 | Amico | Oct. 28, 1952 |
| 2,746,121 | Anderson | May 22, 1956 |
| 2,755,536 | Dickinson | July 24, 1956 |
| 2,792,537 | Martin | May 14, 1957 |
| 2,836,521 | Longini | May 27, 1958 |